(12) United States Patent
Nakabayashi et al.

(10) Patent No.: US 11,424,326 B2
(45) Date of Patent: Aug. 23, 2022

(54) SEMICONDUCTOR DEVICE

(71) Applicant: KABUSHIKI KAISHA TOSHIBA, Tokyo (JP)

(72) Inventors: Yukio Nakabayashi, Yokohama (JP); Tatsuo Shimizu, Shinagawa (JP); Toshihide Ito, Shibuya (JP); Chiharu Ota, Kawasaki (JP); Johji Nishio, Machida (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 61 days.

(21) Appl. No.: 17/158,110

(22) Filed: Jan. 26, 2021

(65) Prior Publication Data

US 2021/0367040 A1   Nov. 25, 2021

(30) Foreign Application Priority Data

May 21, 2020   (JP) .............................. JP2020-088784

(51) Int. Cl.
*H01L 29/10* (2006.01)
*H01L 29/16* (2006.01)
(Continued)

(52) U.S. Cl.
CPC ........ *H01L 29/1608* (2013.01); *H01L 29/045* (2013.01); *H01L 29/7813* (2013.01)

(58) Field of Classification Search
CPC ..... H01L 29/10; H01L 29/1095; H01L 29/16; H01L 29/1608; H01L 29/04;
(Continued)

(56) References Cited

U.S. PATENT DOCUMENTS

| 7,605,424 B2 | 10/2009 | Imoto et al. |
| 2010/0244044 A1 | 9/2010 | Li et al. |

(Continued)

FOREIGN PATENT DOCUMENTS

| JP | 2010-225979 A | 10/2010 |
| JP | 5045686 B2 | 10/2012 |

(Continued)

OTHER PUBLICATIONS

Tamaso et al., "Fast Switching SiC V-groove Trench MOSFETs", SEI Technical Review, No. 86, Apr. 2018, 5 pages.

(Continued)

*Primary Examiner* — Fazli Erdem

(74) *Attorney, Agent, or Firm* — Oblon, McClelland, Maier & Neustadt, L.L.P.

(57) ABSTRACT

According to one embodiment, a semiconductor device includes a silicon carbide member, first, second, and third electrodes, and a first insulating member. The silicon carbide member includes first, second, and third silicon carbide regions. The first silicon carbide region includes first, second, third, and fourth partial regions. The third partial region is between the first and second partial regions. The fourth partial region is between the third partial region and the first electrode. The second silicon carbide region includes first and second semiconductor regions. The third silicon carbide region includes third and fourth semiconductor regions. The first insulating member includes first, second, and third insulating regions. The second electrode is electrically connected to the first silicon carbide region. The third and fourth partial regions are between the second and first electrodes. The third electrode is electrically connected to the second silicon carbide region.

20 Claims, 2 Drawing Sheets

(51) Int. Cl.
    *H01L 29/45*     (2006.01)
    *H01L 29/78*     (2006.01)
    *H01L 29/04*     (2006.01)

(58) Field of Classification Search
    CPC ....... H01L 29/045; H01L 29/45; H01L 29/78; H01L 29/7802; H01L 29/7813
    USPC .......................................................... 257/77
    See application file for complete search history.

(56) References Cited

U.S. PATENT DOCUMENTS

2017/0012119 A1*   1/2017   Konstantinov ..... H01L 21/0465
2021/0288175 A1*   9/2021   Shimizu .............. H01L 29/1095

FOREIGN PATENT DOCUMENTS

JP         2013-157577 A     8/2013
JP         2019-057629 A     4/2019

OTHER PUBLICATIONS

Masuda et al., "0.63 mΩcm$^2$/1170 V 4H-SIC Super Junction V-Groove Trench MOSFET", IEDM, 2018, 4 pages.
Saitoh et al., "V-groove trench gate Sic MOSFET with a double reduced surface field junction termination extensions structure", Japanese Journal of Applied Physics 58, SBBD11, 2019, 8 pages.

* cited by examiner

SEMICONDUCTOR DEVICE

CROSS-REFERENCE TO RELATED APPLICATIONS

This application is based upon and claims the benefit of priority from Japanese Patent Application No. 2020-088784, filed on May 21, 2020; the entire contents of which are incorporated herein by reference.

FIELD

Embodiments generally relate to a semiconductor device.

BACKGROUND

It is desirable to improve the characteristics of a semiconductor device.

DETAILED DESCRIPTION

Figure 1:
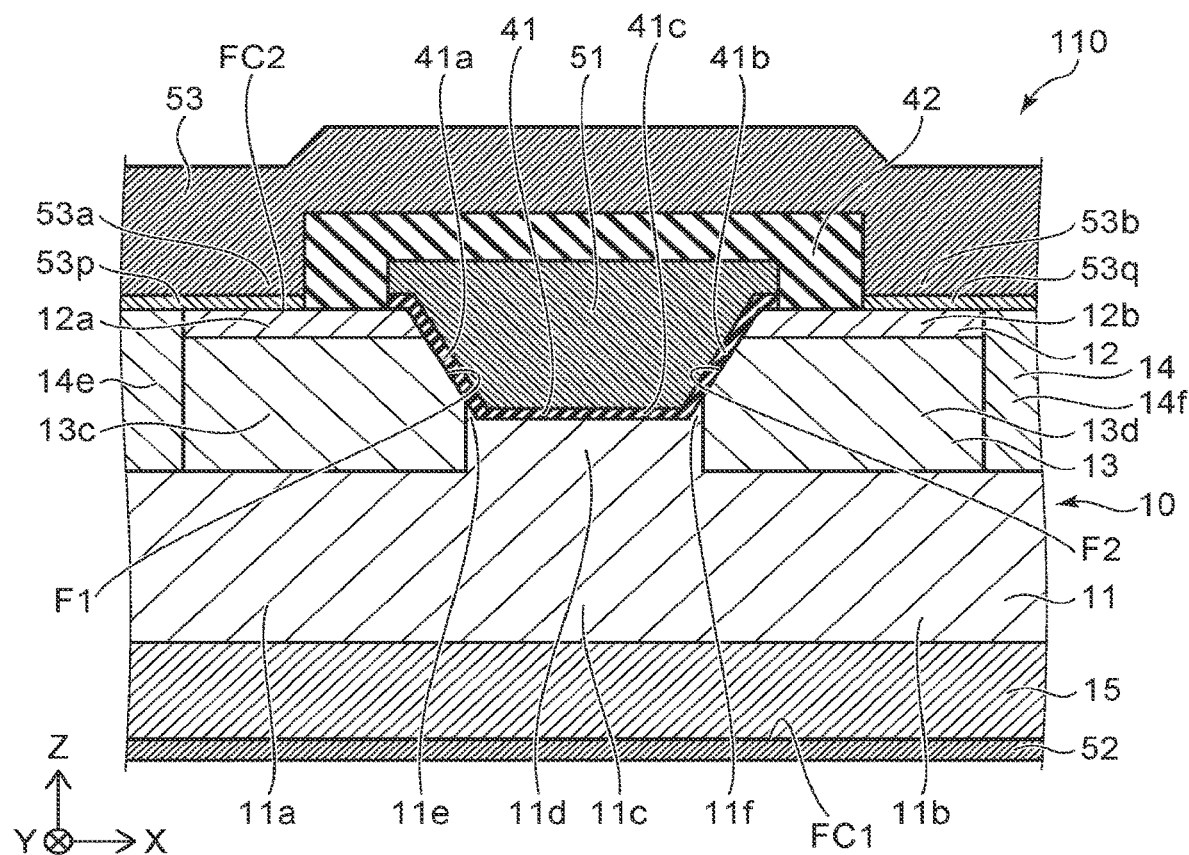
FIG. 1 is a schematic cross-sectional view illustrating a semiconductor device according to an embodiment.

According to one embodiment, a semiconductor device includes a silicon carbide member, a first electrode, a second electrode, a third electrode, and a first insulating member. The silicon carbide member includes a first silicon carbide region, a second silicon carbide region, and a third silicon carbide region. The first silicon carbide region includes a first partial region, a second partial region, a third partial region, and a fourth partial region. The first silicon carbide region is of a first conductivity type. A direction from the first partial region toward the second partial region is along a first direction. The third partial region is between the first partial region and the second partial region. The fourth partial region is between the third partial region and the first electrode in a second direction crossing the first direction. The second silicon carbide region includes a first semiconductor region and a second semiconductor region. The second silicon carbide region is of the first conductivity type. A direction from the first partial region toward the first semiconductor region and a direction from the second partial region toward the second semiconductor region are along the second direction. The third silicon carbide region includes a third semiconductor region and a fourth semiconductor region. The third silicon carbide region is of a second conductivity type. The third semiconductor region is between the first partial region and the first semiconductor region in the second direction. The fourth semiconductor region is between the second partial region and the second semiconductor region in the second direction. The fourth partial region is between the third semiconductor region and the fourth semiconductor region in the first direction. At least a portion of the first electrode is between the first semiconductor region and the second semiconductor region in the first direction and between the third semiconductor region and the fourth semiconductor region in the first direction. The first insulating member includes a first insulating region, a second insulating region, and a third insulating region. The first insulating region is between the first semiconductor region and the first electrode and between the third semiconductor region and the first electrode. The second insulating region is between the first electrode and the second semiconductor region and between the first electrode and the fourth semiconductor region. The third insulating region is between the fourth partial region and the first electrode. The second electrode is electrically connected to the first silicon carbide region. The third partial region and the fourth partial region are between the second electrode and the first electrode. The third electrode is electrically connected to the second silicon carbide region. The first insulating region includes a first surface facing the first and third semiconductor regions. The first surface is oblique to a (0001) plane of the silicon carbide member. The first direction is along the (0001) plane.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

Embodiment

FIG. 1 is a schematic cross-sectional view illustrating a semiconductor device according to an embodiment.

As shown in FIG. 1, the semiconductor device 110 according to the embodiment includes a silicon carbide member 10, a first electrode 51, a second electrode 52, a third electrode 53, and a first insulating member 41.

The silicon carbide member 10 includes a first silicon carbide region 11, a second silicon carbide region 12, and a third silicon carbide region 13.

The first silicon carbide region 11 includes a first partial region 11a, a second partial region 11b, a third partial region 11c, and a fourth partial region 11d. The first silicon carbide region 11 is of a first conductivity type. The direction from the first partial region 11a toward the second partial region 11b is along a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

The third partial region 11c is between the first partial region 11a and the second partial region 11b. The fourth partial region 11d is between the third partial region 11c and the first electrode 51 in a second direction. The second direction crosses the first direction (the X-axis direction). The second direction is, for example, the Z-axis direction. The boundaries between the first partial region 11a, the second partial region 11b, the third partial region 11c, and the fourth partial region 11d may be distinct or indistinct.

The second silicon carbide region 12 includes a first semiconductor region 12a and a second semiconductor region 12b. The second silicon carbide region 12 is of the first conductivity type. The direction from the first partial region 11a toward the first semiconductor region 12a and the direction from the second partial region 11b toward the second semiconductor region 12b are along the second direction (e.g., the Z-axis direction). The first semiconductor region 12*a* and the second semiconductor region 12*b* may be continuous at a different position from the cross section shown in FIG. 1.

The third silicon carbide region 13 includes a third semiconductor region 13*c* and a fourth semiconductor region 13*d*. The third silicon carbide region 13 is of a second conductivity type.

In one example, the first conductivity type is an n-type, and the second conductivity type is a p-type. In another example, the first conductivity type is the p-type, and the second conductivity type is the n-type. Hereinbelow, the first conductivity type is taken to be the n-type, and the second conductivity type is taken to be the p-type.

The first silicon carbide region 11 of the first conductivity type and the second silicon carbide region 12 of the first conductivity type include, for example, at least one selected from the group consisting of N, P, and As as an n-type impurity. The third silicon carbide region 13 of the second conductivity type includes, for example, at least one selected from the group consisting of B, Al, and Ga as a p-type impurity.

For example, the first silicon carbide region 11 includes N. The second silicon carbide region 12 includes P. The third silicon carbide region 13 includes Al.

The third semiconductor region 13*c* is between the first partial region 11*a* and the first semiconductor region 12*a* in the second direction (e.g., the Z-axis direction). The fourth semiconductor region 13*d* is between the second partial region 11*b* and the second semiconductor region 12*b* in the second direction (e.g., the Z-axis direction). The fourth partial region 11*d* is between the third semiconductor region 13*c* and the fourth semiconductor region 13*d* in the first direction (the X-axis direction). The third semiconductor region 13*c* and the fourth semiconductor region 13*d* may be continuous at a different position from the cross section shown in FIG. 1.

At least a portion of the first electrode 51 is between the first semiconductor region 12*a* and the second semiconductor region 12*b* in the first direction (the X-axis direction) and between the third semiconductor region 13*c* and the fourth semiconductor region 13*d* in the first direction (the X-axis direction).

The first insulating member 41 includes a first insulating region 41*a*, a second insulating region 41*b*, and a third insulating region 41*c*. The first insulating region 41*a* is between the first semiconductor region 12*a* and the first electrode 51 and between the third semiconductor region 13*c* and the first electrode 51. The second insulating region 41*b* is between the first electrode 51 and the second semiconductor region 12*b* and between the first electrode 51 and the fourth semiconductor region 13*d*. The third insulating region 41*c* is between the fourth partial region 11*d* and the first electrode 51. The first insulating member 41 electrically insulates the silicon carbide member 10 and the first electrode 51.

The second electrode 52 is electrically connected to the first silicon carbide region 11. In the example, the third partial region 11*c* and the fourth partial region 11*d* are between the second electrode 52 and the first electrode 51 in the Z-axis direction. The third insulating region 41*c* is between the second electrode 52 and the first electrode 51 in the Z-axis direction.

The third electrode 53 is electrically connected to the second silicon carbide region 12. For example, a portion 53*a* of the third electrode 53 is electrically connected to the first semiconductor region 12*a*. For example, a portion 53*b* of the third electrode 53 is electrically connected to the second semiconductor region 12*b*. In the example, a contact region 53*p* is provided between the first semiconductor region 12*a* and the portion 53*a* described above. In the example, a contact region 53*q* is provided between the second semiconductor region 12*b* and the portion 53*b* described above. The contact region 53*p* and the contact region 53*q* include, for example, a silicide.

The first electrode 51 is, for example, a gate electrode. The second electrode 52 is, for example, a drain electrode. The third electrode 53 is, for example, a source electrode. A current that flows between the second electrode 52 and the third electrode 53 can be controlled by controlling the potential of the first electrode 51. The semiconductor device 110 is, for example, a transistor.

In the example as shown in FIG. 1, the silicon carbide member 10 further includes a fourth silicon carbide region 14. The fourth silicon carbide region 14 is of the second conductivity type (e.g., the p-type). The fourth silicon carbide region 14 includes a fifth semiconductor region 14*e* and a sixth semiconductor region 14*f*. The first semiconductor region 12*a* is between the fifth semiconductor region 14*e* and the first insulating member 41 in the first direction (the X-axis direction). The second semiconductor region 12*b* is between the first insulating member 41 and the sixth semiconductor region 14*f* in the first direction (the X-axis direction). The fourth silicon carbide region 14 is electrically connected to the third electrode 53. The fourth silicon carbide region 14 is electrically connected to the third silicon carbide region 13. For example, the potential of the third silicon carbide region 13 is stabilized by electrically connecting the third silicon carbide region 13 to the third electrode 53 via the fourth silicon carbide region 14.

In the example as shown in FIG. 1, the silicon carbide member 10 further includes a fifth silicon carbide region 15. The fifth silicon carbide region 15 is between the second electrode 52 and the first silicon carbide region 11. The fifth silicon carbide region 15 may be, for example, a silicon carbide substrate.

For example, the fifth silicon carbide region 15 is provided on the second electrode 52. The first silicon carbide region 11 is provided on the fifth silicon carbide region 15. The third semiconductor region 13*c* is provided on a portion of the first silicon carbide region 11. The first semiconductor region 12*a* is provided on the third semiconductor region 13*c*. The fourth semiconductor region 13*d* is provided on another portion of the first silicon carbide region 11. The second semiconductor region 12*b* is provided on the fourth semiconductor region 13*d*. The first partial region 11*a*, the second partial region 11*b*, and the third partial region 11*c* of the first silicon carbide region 11 correspond to, for example, a drift layer region. The fourth partial region 11*d* corresponds to a JFET region.

As shown in FIG. 1, the first insulating region 41*a* includes a first surface F1. The first surface F1 faces the first semiconductor region 12*a* and the third semiconductor region 13*c*. The first surface F1 is oblique to the (0001) plane of the silicon carbide member 10. For example, the first direction (the X-axis direction) is along the (0001) plane.

For example, high mobility is obtained by setting the first surface F1 to be oblique to the (0001) plane of the silicon carbide member 10. In the semiconductor device 110, a channel is formed at the vicinity of the oblique first insulating region 41*a*. Current flows in the oblique direction.

For example, there is a first reference example in which the channel is parallel to the X-Y plane. The mobility is low in the first reference example. A higher mobility than the first reference example is obtained in the embodiment by setting the first surface F1 to be oblique to the (0001) plane of the silicon carbide member 10.

On the other hand, a second reference example may be considered in which the fourth partial region 11d is not provided between the third semiconductor region 13c and the fourth semiconductor region 13d and the channel is oblique to the (0001) plane. In the second reference example, for example, the electric field easily concentrates at the third insulating region 41c.

Conversely, in the embodiment, the fourth partial region 11d is provided between the third semiconductor region 13c and the fourth semiconductor region 13d. Thereby, compared to the second reference example, the concentration of the electric field can be suppressed in the embodiment.

According to the embodiment, high mobility is obtained. For example, a low on-resistance is obtained. For example, the concentration of the electric field can be suppressed, and a high breakdown voltage is obtained. For example, high reliability is obtained. According to the embodiment, a semiconductor device can be provided in which the characteristics can be improved.

In the embodiment, the angle between the first surface F1 and the (0001) plane is, for example, not less than 5 degrees and not more than 85 degrees. This angle may be not less than 20 degrees and not more than 70 degrees. This angle may be not less than 20 degrees and not more than 45 degrees. This angle may be not less than 45 degrees and not more than 70 degrees.

For example, the first surface F1 may be along the (0-33-8) plane of the silicon carbide member 10. For example, the first surface F1 may be along the (0-3-38) plane of the silicon carbide member 10.

In the notation of crystal orientations and planes of this specification, the "-" corresponds to a "bar" of the numeral after the "-".

As shown in FIG. 1, the second insulating region 41b includes a second surface F2. The second surface F2 faces the second semiconductor region 12b and the fourth semiconductor region 13d. In the embodiment, the second surface F2 may be oblique to the (0001) plane of the silicon carbide member 10. High mobility is obtained by such an oblique second surface F2.

In the embodiment, the angle between the second surface F2 and the (0001) plane is, for example, not less than 5 degrees and not more than 85 degrees. This angle may be not less than 20 degrees and not more than 70 degrees.

For example, the second surface F2 may be along the (0-33-8) plane of the silicon carbide member 10. The second surface F2 may be along the (0-3-38) plane of the silicon carbide member 10. In one example, the first surface F1 is along the (0-33-8) plane, and the second surface F2 is along the (03-3-8) plane. In one example, the first surface F1 is along the (03-38) plane, and the second surface F2 is along the (0-338) plane.

For example, the silicon carbide member 10 includes 4H—SiC. For example, the upper surface of the silicon carbide member 10 is a Si-surface. For example, the upper surface of the silicon carbide member 10 is a C-surface. For example, the Si-surface corresponds to the (0001) plane. For example, the C-surface corresponds to the (000-1) plane.

As shown in FIG. 1, the silicon carbide member 10 includes a first counter surface FC1. The first counter surface FC1 faces the second electrode 52. For example, the first counter surface FC1 is along the (0001) plane.

For example, the second silicon carbide region 12 includes a second counter surface FC2 facing the third electrode 53. For example, the second counter surface FC2 is along the (0001) plane.

For example, the first insulating member 41 includes silicon and oxygen. For example, the first insulating member 41 includes $SiO_2$. The first insulating member 41 may include silicon, oxygen, and nitrogen.

For example, the surface density of the Si atoms of $SiO_2$ is about $2.2\times10^{14}$ $cm^{-2}$. On the other hand, the surface density of the Si atoms of a Si-surface of SiC is about $12\times10^{14}$ $cm^{-2}$, and is much different from that of $SiO_2$. The surface density of the Si atoms of the a-plane of SiC is about $7.4\times10^{14}$ $cm^{-2}$. The surface density of the Si atoms of the m-plane of SiC is about $6.4\times10^{14}$ $cm^{-2}$. The surface density of the Si atoms of the (0-33-8) plane of SiC is about $1.7\times10^{14}$ $cm^{-2}$. The surface density of the Si atoms of the (03-38) plane of SiC is about $0.57\times10^{14}$ $cm^{-2}$. By setting the first surface F1 (and the second surface F2) to be oblique to the (0001) plane, the difference between the surface density of the Si atoms of the surface of the silicon carbide member 10 and the surface density of the Si atoms of $SiO_2$ can be small. For example, the density of unbonded groups of Si can be reduced by reducing the surface density difference. It is considered that the mobility can be improved by setting the first surface F1 (and the second surface F2) to be oblique to the (0001) plane based on the reduction of the density of unbonded groups of Si.

As shown in FIG. 1, the first silicon carbide region 11 may further include a fifth partial region 11e. The fifth partial region 11e is between the third semiconductor region 13c and the third insulating region 41c in the first direction (the X-axis direction). By providing the fifth partial region 11e, for example, the local concentration of the electric field at the corner portion of the bottom portion of the first insulating member 41 can be suppressed. For example, a stable breakdown voltage is obtained. For example, high reliability is obtained.

For example, at least a portion of the fifth partial region 11e may be provided between the third semiconductor region 13c and the first electrode 51 in the first direction (the X-axis direction). The concentration of the electric field can be further suppressed thereby.

As shown in FIG. 1, the first silicon carbide region 11 may further include a sixth partial region 11f. The sixth partial region 11f is between the third insulating region 41c and the fourth semiconductor region 13d in the first direction (the X-axis direction). By providing the sixth partial region 11f, for example, the local concentration of the electric field at the corner portion of the bottom portion of the first insulating member 41 can be suppressed. For example, a stable breakdown voltage is obtained. For example, high reliability is obtained.

For example, at least a portion of the sixth partial region 11f may be provided between the first electrode 51 and the fourth semiconductor region 13d in the first direction (the X-axis direction). The concentration of the electric field can be further suppressed thereby.

For example, the semiconductor device 110 can be formed by forming a recess by removing a portion of the silicon carbide member used to form the silicon carbide member 10, and by filling the first insulating member 41 and the first electrode 51 into the recess. The first surface F1 and the second surface F2 such as those described above are obtained by etching the recess to have oblique side surfaces. For example, the oblique first and second surfaces F1 and F2 are easily obtained by using an etchant such as chlorine, etc. The semiconductor device 110 according to the embodiment can be manufactured easily.

The impurity concentration (or the carrier concentration) of the first conductivity type in the second silicon carbide region 12 is, for example, greater than the impurity concentration (or the carrier concentration) of the first conductivity type in the first silicon carbide region 11. For example, the first silicon carbide region 11 is an n-layer, and the second silicon carbide region 12 is an n$^+$-layer. For example, the impurity concentration of the first conductivity type in the first silicon carbide region 11 is not less than $5\times10^{15}$ cm$^{-3}$ and not more than $5\times10^{16}$ cm$^{-3}$. For example, the impurity concentration of the first conductivity type in the second silicon carbide region 12 is not less than $1\times10^{19}$ cm$^{-3}$ and not more than $1\times10^{20}$ cm$^{-3}$.

The impurity concentration (or the carrier concentration) of the first conductivity type in the fifth silicon carbide region 15 is, for example, greater than the impurity concentration (or the carrier concentration) of the first conductivity type in the first silicon carbide region 11. For example, the fifth silicon carbide region 15 is an n$^+$-layer. For example, the impurity concentration of the first conductivity type in the fifth silicon carbide region 15 is not less than $5\times10^{18}$ cm$^{-3}$ and not more than $1\times10^{19}$ cm$^{-3}$.

The impurity concentration (or the carrier concentration) of the second conductivity type in the fourth silicon carbide region 14 is, for example, greater than the impurity concentration (or the carrier concentration) of the second conductivity type in the third silicon carbide region 13. For example, the third silicon carbide region 13 is a p-layer, and the fourth silicon carbide region 14 is a p$^+$-layer. For example, the impurity concentration of the second conductivity type in the third silicon carbide region 13 is not less than $5\times10^{15}$ cm$^{-3}$ and not more than $5\times10^{18}$ cm$^{-3}$. For example, the impurity concentration of the second conductivity type in the fourth silicon carbide region 14 is not less than $1\times10^{19}$ cm$^{-3}$ and not more than $1\times10^{20}$ cm$^{-3}$.

As shown in FIG. 1, the semiconductor device 110 may include a second insulating member 42. The second insulating member 42 is provided between the first electrode 51 and the third electrode 53. The second insulating member 42 electrically insulates the first electrode 51 and the third electrode 53.

Figure 2:
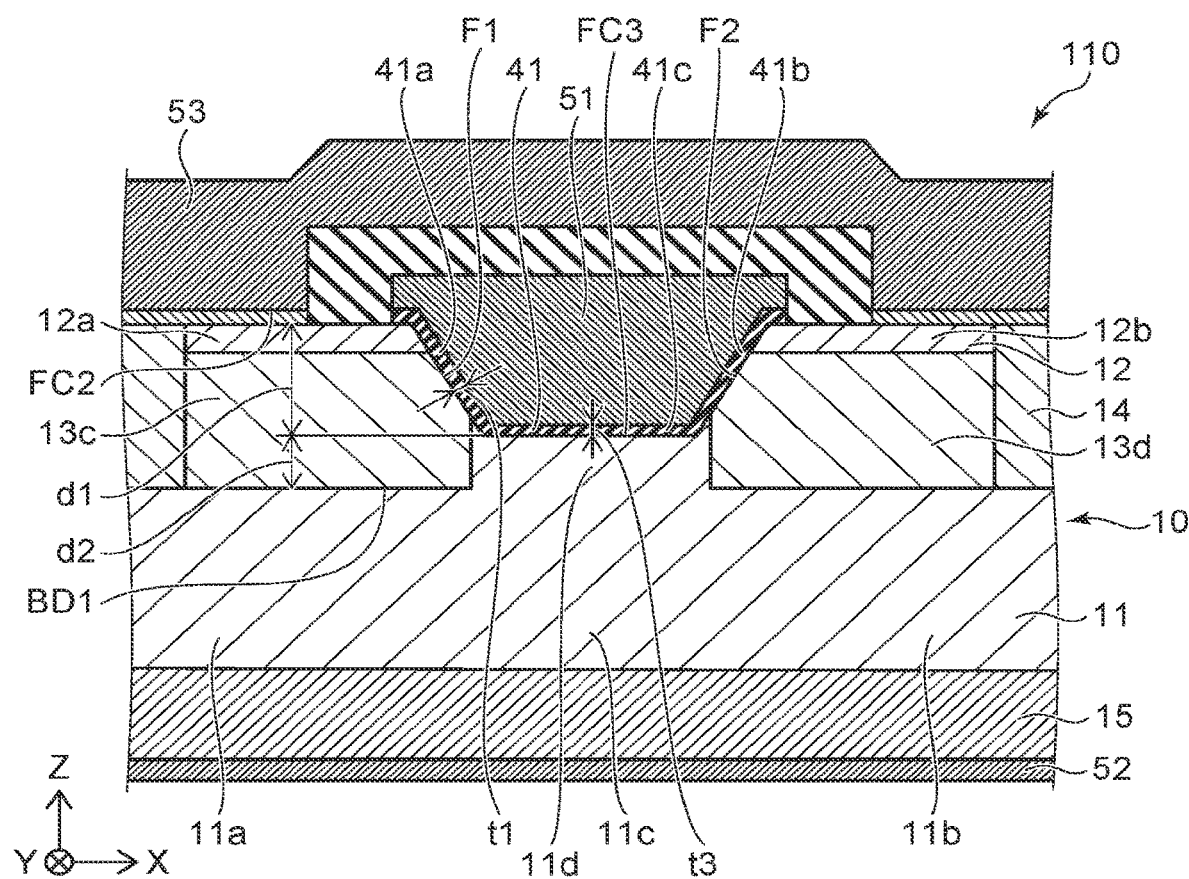
FIG. 2 is a schematic cross-sectional view illustrating the semiconductor device according to the embodiment.

FIG. 2 is a schematic cross-sectional view illustrating the semiconductor device according to the embodiment.

As shown in FIG. 2, the second silicon carbide region 12 includes the second counter surface FC2 facing the third electrode 53. For example, the second counter surface FC2 corresponds to the upper surface of the silicon carbide member 10. The third insulating region 41c includes a third counter surface FC3 facing the fourth partial region 11d. The third counter surface FC3 corresponds to the bottom surface of the bottom portion of the first insulating member 41.

As shown in FIG. 2, the distance in the second direction (the Z-axis direction) between the position in the second direction (e.g., the Z-axis direction) of the second counter surface FC2 and the position in the second direction (the Z-axis direction) of the third counter surface FC3 is taken as a first distance d1. The first distance d1 corresponds to the depth of the recess in which the first insulating member 41 is provided. In the embodiment, the first distance d1 is, for example, not less than 0.2 μm and not more than 0.8 μm.

As shown in FIG. 2, the distance in the second direction (the Z-axis direction) between the position in the second direction (the Z-axis direction) of the third counter surface FC3 and the position in the second direction (the Z-axis direction) of a boundary BD1 between the third semiconductor region 13c and the first partial region 11a is taken as a second distance d2. The second distance d2 corresponds to the difference between the depth of the bottom portion of the third semiconductor region 13c and the depth of the bottom portion of the third insulating region 41c. In the embodiment, the second distance d2 is, for example, not less than 0.05 μm and not more than 0.8 μm.

As shown in FIG. 2, the thickness of the first insulating region 41a along a direction perpendicular to the first surface F1 is taken as a thickness t1. In the embodiment, the thickness t1 is, for example, not less than 10 nm and not more than 100 nm.

As shown in FIG. 2, the thickness of the third insulating region 41c along the second direction (the Z-axis direction) is taken as a thickness t3. In the embodiment, the thickness t3 is, for example, not less than 10 nm and not more than 100 nm. When the thickness t3 is less than the thickness t1, the second distance d2 can be reduced, and the resistance of the element can be reduced.

In the embodiment, the first electrode 51 includes, for example, polysilicon. At least one of the second electrode 52 or the third electrode 53 includes, for example, at least one selected from the group consisting of Ni, Mo, W, V, Co, Ti, Au, Cu, and Al. At least one of the second electrode 52 or the third electrode 53 may include a silicide.

According to the embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as silicon carbide members, silicon carbide regions, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a silicon carbide member including a first silicon carbide region, a second silicon carbide region, and a third silicon carbide region;
a first electrode;
a second electrode;
a third electrode; and
a first insulating member,
the first silicon carbide region including a first partial region, a second partial region, a third partial region, and a fourth partial region, the first silicon carbide region being of a first conductivity type, a direction from the first partial region toward the second partial region being along a first direction, the third partial region being between the first partial region and the second partial region,
the fourth partial region being between the third partial region and the first electrode in a second direction crossing the first direction,
the second silicon carbide region including a first semiconductor region and a second semiconductor region, the second silicon carbide region being of the first conductivity type, a direction from the first partial region toward the first semiconductor region and a direction from the second partial region toward the second semiconductor region being along the second direction,
the third silicon carbide region including a third semiconductor region and a fourth semiconductor region, the third silicon carbide region being of a second conductivity type, the third semiconductor region being between the first partial region and the first semiconductor region in the second direction, the fourth semiconductor region being between the second partial region and the second semiconductor region in the second direction, the fourth partial region being between the third semiconductor region and the fourth semiconductor region in the first direction,
at least a portion of the first electrode being between the first semiconductor region and the second semiconductor region in the first direction and between the third semiconductor region and the fourth semiconductor region in the first direction,
the first insulating member including a first insulating region, a second insulating region, and a third insulating region, the first insulating region being between the first semiconductor region and the first electrode and between the third semiconductor region and the first electrode, the second insulating region being between the first electrode and the second semiconductor region and between the first electrode and the fourth semiconductor region, the third insulating region being between the fourth partial region and the first electrode,
the second electrode being electrically connected to the first silicon carbide region,
the third partial region and the fourth partial region being between the second electrode and the first electrode,
the third electrode being electrically connected to the second silicon carbide region,
the first insulating region including a first surface facing the first and third semiconductor regions,
the first surface being oblique to a (0001) plane of the silicon carbide member,
the first direction being along the (0001) plane.

2. The device according to claim 1, wherein
an angle between the first surface and the (0001) plane is not less than 5 degrees and not more than 85 degrees.

3. The device according to claim 1, wherein
the first surface is along a (0-33-8) plane of the silicon carbide member.

4. The device according to claim 1, wherein
the first surface is along a (0-3-38) plane of the silicon carbide member.

5. The device according to claim 1, wherein
the second insulating region includes a second surface facing the second and fourth semiconductor regions, and
the second surface is oblique to a (0001) plane of the silicon carbide member.

6. The device according to claim 5, wherein
an angle between the second surface and the (0001) plane is not less than 5 degrees and not more than 85 degrees.

7. The device according to claim 5, wherein
the second surface is along a (0-33-8) plane of the silicon carbide member.

8. The device according to claim 5, wherein
the second surface is along a (0-3-38) plane of the silicon carbide member.

9. The device according to claim 1, wherein
the silicon carbide member includes a first counter surface facing the second electrode, and
the first counter surface is along the (0001) plane.

10. The device according to claim 1, wherein
the silicon carbide member includes 4H—SiC.

11. The device according to claim 1, wherein
the first silicon carbide region further includes a fifth partial region, and
the fifth partial region is between the third semiconductor region and the third insulating region in the first direction.

12. The device according to claim 11, wherein
at least a portion of the fifth partial region is between the third semiconductor region and the first electrode in the first direction.

13. The device according to claim 11, wherein
the first silicon carbide region further includes a sixth partial region, and
the sixth partial region is between the third insulating region and the fourth semiconductor region in the first direction.

14. The device according to claim 13, wherein
at least a portion of the sixth partial region is between the first electrode and the fourth semiconductor region in the first direction.

15. The device according to claim 1, wherein
the silicon carbide member further includes a fourth silicon carbide region of the second conductivity type,
the fourth silicon carbide region includes a fifth semiconductor region and a sixth semiconductor region,
the first semiconductor region is between the fifth semiconductor region and the first insulating member in the first direction,
the second semiconductor region is between the first insulating member and the sixth semiconductor region in the first direction, and
the fourth silicon carbide region is electrically connected to the third electrode.

16. The device according to claim 1, wherein
the second silicon carbide region includes a second counter surface facing the third electrode, the third insulating region includes a third counter surface facing the fourth partial region, and a first distance in the second direction between a position in the second direction of the second counter surface and a position in the second direction of the third counter surface is not less than 0.2 μm and not more than 0.8 μm.

17. The device according to claim 1, wherein the third insulating region includes a third counter surface facing the fourth partial region, and a second distance in the second direction between a position in the second direction of the third counter surface and a position in the second direction of a boundary between the third semiconductor region and the first partial region is not less than 0.05 μm and not more than 0.8 μm.

18. The device according to claim 1, wherein a thickness of the first insulating region along a direction perpendicular to the first surface is not less than 10 nm and not more than 100 nm.

19. The device according to claim 1, wherein a thickness of the third insulating region along the second direction is not less than 10 nm and not more than 100 nm.

20. The device according to claim 1, wherein the first insulating member includes silicon and oxygen.

* * * * *